United States Patent [19]

Sonoda

[11] Patent Number: 4,932,068
[45] Date of Patent: Jun. 5, 1990

[54] METHOD OF RECORDING A PLURALITY OF IMAGES IN SUPERPOSITION ON A RECORDING MEDIUM

[75] Inventor: Takakuni Sonoda, Nagoya, Japan
[73] Assignee: Brother Kogyo Kabushiki Kaisha, Japan
[21] Appl. No.: 307,779
[22] Filed: Feb. 8, 1989
[30] Foreign Application Priority Data
Feb. 9, 1988 [JP] Japan .................................. 63-28152
[51] Int. Cl.⁵ ............................................ G03B 27/30
[52] U.S. Cl. ........................................ 355/77; 355/27; 355/32; 430/138
[58] Field of Search .................... 430/44, 138; 355/32, 355/77, 202, 27

[56] References Cited

U.S. PATENT DOCUMENTS

| | | | |
|---|---|---|---|
| 2,847,307 | 8/1958 | Thiele ............................... | 355/32 X |
| 4,514,081 | 4/1985 | Tamura .............................. | 355/202 |
| 4,748,475 | 5/1988 | Ishiyama et al. .................. | 355/32 X |
| 4,772,922 | 9/1988 | Kawahara et al. .................... | 355/32 |

FOREIGN PATENT DOCUMENTS

| | | |
|---|---|---|
| 0107184A1 | 10/1983 | European Pat. Off. . |
| 1186250A | 4/1970 | United Kingdom . |
| 2171807A | 9/1986 | United Kingdom . |
| 2180658A | 4/1987 | United Kingdom . |
| 2180794A | 4/1987 | United Kingdom . |

*Primary Examiner*—Richard A. Wintercorn
*Attorney, Agent, or Firm*—Oliff & Berridge

[57] ABSTRACT

In one of the embodiments of the invention, a plurality of originals is sequentially optically scanned and the image bearing light is applied to each of a plurality of photosensitive recording sheets to form a latent image corresponding to one of the originals. The photosensitive recording sheet is brought to facial contact with a developer sheet to develop the latent image and provide a visible image on the developer sheet. The developer sheet is circulated so that it is again brought to facial contact with the subsequent photosensitive recording sheet on which another latent image is formed by optically scanning a different original. In this manner, a plurality of images on different originals are recorded in superposition on a single recording medium. In another embodiment of the invention, an image of a single sheet of original is analyzed to a character image and images of primary color components. A predetermined number of mask members are provided each having a light shielding image corresponding to each of the analyzed images. Latent images of the primary color components are formed on a single photosensitive recording sheet in superposition and the latent image of the character image is formed in another photosensitive recording sheet. The latent images of these two are developed in superposition on a single developer sheet.

8 Claims, 9 Drawing Sheets

METHOD OF RECORDING A PLURALITY OF IMAGES IN SUPERPOSITION ON A RECORDING MEDIUM

BACKGROUND OF THE INVENTION

The present invention relates generally to a method of recording a plurality of images in superposition on a recording medium.

A recording apparatus as shown in FIG. 7 has been proposed in the copending U.S. patent application Ser. No. 07/175,392 filed by Masashi UEDA et al on March 30, 1988. The recording apparatus in FIG. 7 includes a monochromatic laser printer 1 in which a scanner unit 2 is provided. The scanner unit 2 includes a multi-face polygon scanner 2a rotatably provided for directing a laser light onto a photosensitive drum 3. The drum 3 has been previously charged to a predetermined polarity and when the laser light is irradiated thereonto, an electrostatic latent image is formed thereon. The latent image on the drum 3 is developed by toner powders contained in a toner reservoir 4, and the thus developed toner image is transferred onto an ordinary paper or a transparent sheet for use, for example, in an overhead projector, which is fed from a sheet cassette 5. The toner image transferred onto the paper or sheet is then fixed by a fixing unit 6. Normally, the monochromatic laser printer 1 records data transmitted from a host computer (not shown). A color image recording apparatus 20 is disposed beneath the laser printer 1 and records an image using mask members having a light shielding image thereon recorded in accordance with the color picture data. In the apparatus shown in FIG. 7, when a monochromatic image output is needed, such a copy is produced by the monochromatic laser printer 1 and is discharged onto a tray 11 or 12.

The color recording apparatus 20 includes a paper guide unit 10 which guides the mask members 22R, 22G and 22B to be fed into an exposue init 36. An exposure stand 25 is disposed beneath the exposure unit 36, which brings the mask member to facial contact with a photosensitive pressure-sensitive recording medium 24. In the exposure unit 36, light sources 21R, 21G, 21B are arranged in a direction perpendicular to the sheet of drawing for emitting three primary color lights of red, green and blue, respectively. In the drawing, only one light source is illustrated for the sake of simplicity. The recording medium 24 is sequentially exposed to light from each of the light sources through the associated mask member, and is then fed into a developing unit 28. A sheet cassette 27 is provided in the bottom portion of the apparatus for accommodating a stack of developer sheets 26. One surface of the developer sheet 26 is coated with a developer material which reacts with a chromagenic material encapsulated in a microcapsule on the surface of the recording medium 24. The developer sheet 26 and the recording medium 24 are fed into the pressure developing unit 28 while being held in facial contact with each other, in which the microcapsules which remain uncured are ruptured and an image is developed on the developer sheet 26. After passing through the developing unit 28, the exhausted microcapsule sheet 24 is wound around a take-up roller 37 and the developer sheet 26 is fed into a thermal fixing unit 29 for accelerating the fixing of the developed image. A discharge tray 30 is provided for receiving the output copy sheet. An insertion tray 31 is provided for allowing the mask members to be inserted therefrom. The mask members are discharged onto a discharge tray 32. An insertion tray 33 is further provided for allowing a developer sheet to be inserted therefrom.

The apparatus shown in FIG. 7 uses a photosensitive pressure-sensitive recording medium as disclosed. for example, in U.S. Pat. Nos. 4,440,846 or 4,399,209. The former U.S. Patent discloses a self-contained type recording medium and the latter discloses a transfer type recording medium. In the self-contained type, an encapsulated chromogenic material or dye precursour and a developer material are co-deposited on one surface of a single substrate as one layer or as two contiguous layers. In the transfer type, the developer material is coated on a separate substrate as a separate developer sheet. Both the self-contained type and the transfer type are sensitive to light and pressure.

More specifically, such a photosensitive pressure-sensitive recording medium has a substrate on which three kinds of pressure rupturable microcapsules are dispersely deposited. Cyan (C), magenta (M) and yellow (Y) chromogenic materials or dye precursours are separately encapsulated in the microcapsules together with a photo-curing or photo-softening material. The three kinds of the microcapsules are different in photo-sensitivity depending upon the wavelength of light. For example, the microcapsules containing cyan, magenta and yellow chromogenic materials are photo-cured or photo-softened in response to the wavelengths of 650 nm, 550 nm, 450 nm, respectively. By exposing the recording medium to the lights of such wavelengths. a latent image is formed thereon. The recording medium is then subjected to pressure development to repture the microcapsules which have not photo-cured or remained softened and to react the chromogenic materials released from the ruptured microcapsules with a developer material, whereby a visible image is provided on the same recording medium or a separate developer sheet.

Referring to FIG. 2. a priciple of color image reproduction will be described in far more detail. In the following description, a recording medium of the transfer type and photo-curing type will be taken as an example. When the recording medium is exposed to light from a red-color light source 21R through a mask member 22R, the exposed cyan microcapsules are photo-cured whereas unexposed cyan microcapsules remain uncured. The magenta and yellow microcapsules are not photo-cured even if those are exposed to the red-color light. Similarly, the magenta and yellow microcapsules are photo-cured when exposed to green and blue lights. respectively. In this manner, the same recording medium is successively exposed to the respective lights through the associated mask members 22R, 22G and 22B. In a portion of the recording medium to which the lights are applied because of absence of mask portions in any of the mask members. all the microcapsules therein are photo-cured. so that this portion is reproduced in white (W) color. The portion shielded by the mask member 22R is reproduced in cyan (C) color, since the cyan microcapsules remain uncured. Likewise, the portion shielded by the mask member 22G is reproduced in magent (M) color and the portion shieldied by the mask member 22B is reproduced in yellow (Y). The portion shielded by both the mask members 22R and 22G is reproduced in blue (B), the portion shielded by both the mask members 22G and 22B is reproduced in red (R). and the protion shielded by both the mask members 22B and 22R is reproduced in green (G). The portion which has not exposed to any of the lights is reproduced in black (K). According to such a principle, a desired color image can be reproduced by the use of three kinds of the mask members.

However, the use of the three mask members is liable to incur positional displacement of the images when the mask image on each of the mask members is formed in superposition on the recording medium. Therefore, when the exposure is taken placed, it is requisite that the positioning of each of the mask members be ensured, otherwise color displacement or color slip would result. Such a color slip is particularly notable when reproducing a character of black color.

FIG. 4 is an explanatory diagram for description of a character reproduction. In FIG. 4, denoted by 101R, 101G and 101B indicate the same character on each of the mask members. If the mask members are slightly displaced with respect to a stationarily positioned photosensitive pressure-sensitive recording medium when exposure is carried out, the overlapped poriton 102 indicated by oblique lines is reproduced in black but the regions adjacent thereto are reproduced in colors of cyan (C), magenta (M), yellow (Y), red (R), blue (B), green (G), or the like. As indicated, the character as reproduced is blurred and is not good in resolution power.

Although it has been described a conventional recoding method in which a plurality of mask members are used for recording an image on a single sheet of original. It is desirable that a plurality of images on different originals be recorded in superposition on a single image recording medium.

SUMMARY OF THE INVENTION

The present invention has been made in light of the foregoing and it is accordingly an object of this invention to eliminate the color slip by reducing the number of mask members used in reproducing an image on a recording medium.

It is another object of this invention to provide a high quality image on the recording medium.

It is still another object of this invention to provide a recording method in which a plurality of images provided in different originals are recorded in superposition on a single recording medium.

In order to achieve the above and other objects, there is provided, according to a first aspect of the invention, a method of recording a plurality of images on a first recording medium with the use of a plurality of second recording mediums, the method comprising the steps of:

sequentially forming a latent image of each of the plurality of images on each of the plurality of second recording mediums; and sequentially developing the latent image of each of the plurality of images and providing a visible image corresponding thereto on the first recording medium in multiplex form.

Since the first recording medium is repeatedly subjected to the development with respect to a plurality of latent images, a plurality of images on different originals can be recorded in multiplex form on a single recording medium.

According to a second aspect of the invention, there is provided a method of recording a predetermined number of images on a first recording medium with the use of two sheets of a second recording medium, the method comprising the steps of:

discriminating the predetermined number of images between a first group containing a first number of images and a second group containing a second number of images;

sequentially forming a latent image of each of the first number of images in superposition on one of the two second recording mediums;

sequentially forming a latent image of each of the second number of images in superposition on the other of the two second recording mediums; and sequentially developing the latent images of each of the two second recording mediums and providing visible images in superposition on the first recording medium.

According to this method, there are provided a predetermined number of mask members equal to the predetermined number of images based upon an original containing an image to be reproduced. Each of the predetermined number of mask members contains a light shielding image corresponding to each of the predetermined number of images, and the latent image of each of the first number of images is sequentially formed in superposition on the one of the two recording mediums by irradiating light thereonto through the mask members corresponding to the first group and the latent images of each of the second number of images is sequentially formed in superposition on the other of the two recording mediums by irradiating light thereonto through the mask members corresponding to the second group. Since the plurality of images which altogether constitute an image of an original are recorded in superposition on a single recording sheet with the use of only two second recording mediums, no color slip occurs even if a fine line image, such as character, is contained in the original.

DESCRIPTION OF THE PREFERRED EMBODIMENTS

Preferred embodiments of the present invention will now be described with reference to the accompanying drawings.

Figure 5:
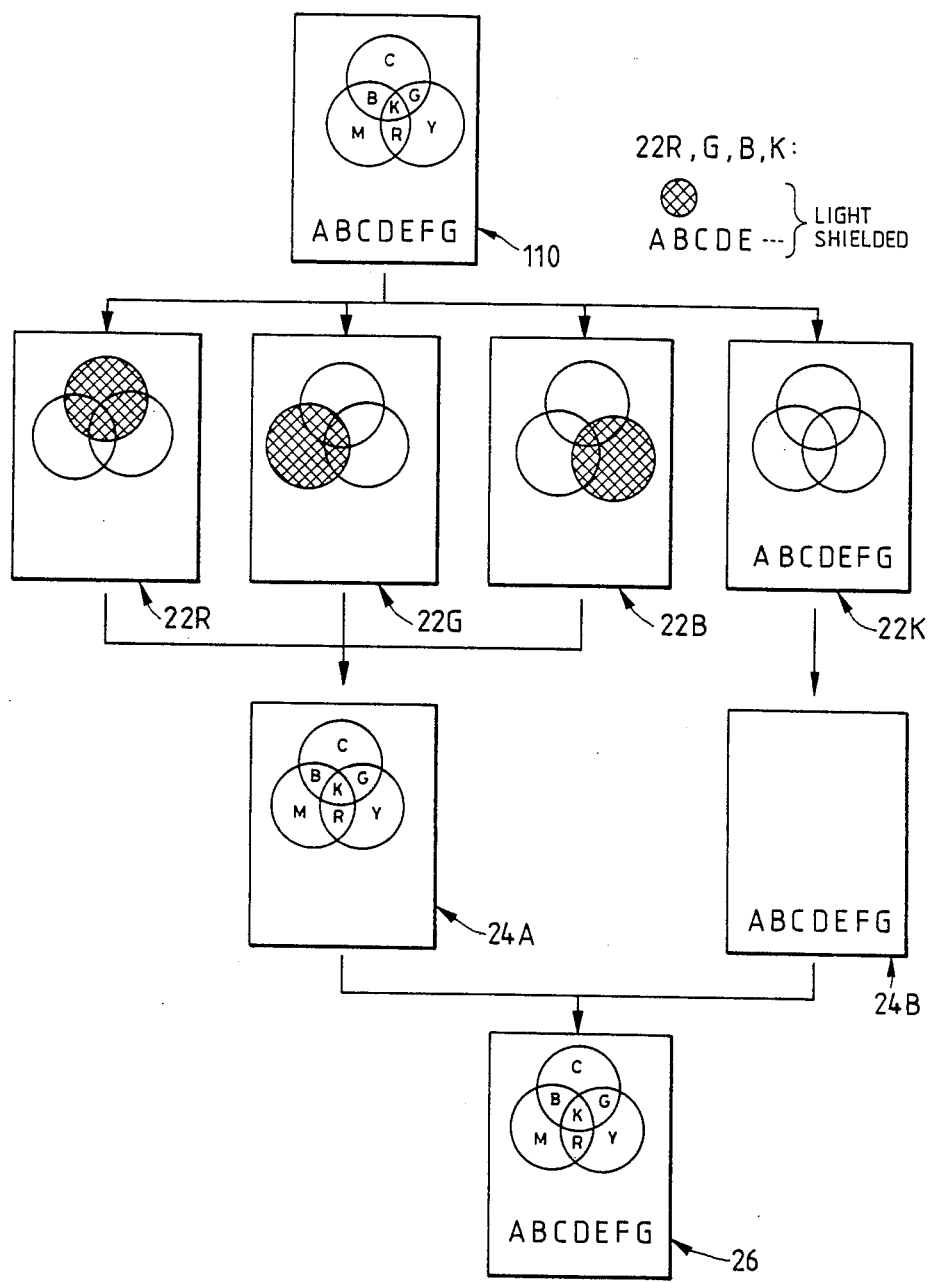
FIG. 5 is an explanatory diagram for description of a process according to the image recording method of the present invention.
Figure 7:
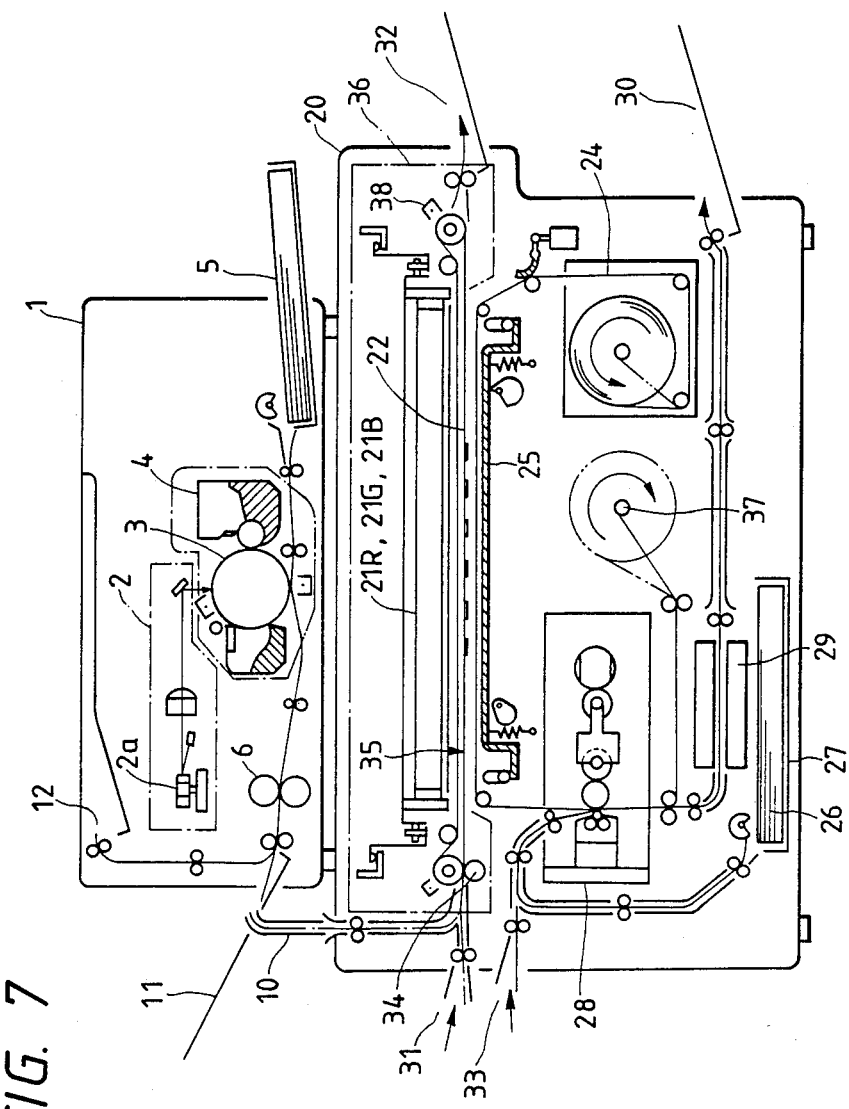
FIG. 7 is a vertical cross-sectional view showing a color image recording apparatus to which a conventional image recording method is applied.

An image recording method according to a first embodiment will be described with reference to the apparatus shown in FIG. 7. FIG. 5 is an explanatory diagram for description of a recording method according to the first embodiment, in which two sheets of photosensitive pressure-sensitive recording sheet 24A and 24B and one developer sheet 26 are used for reproducing images on an original 110 containing both black-color characters and a three-circle-overlapped full color image.

Figure 3:
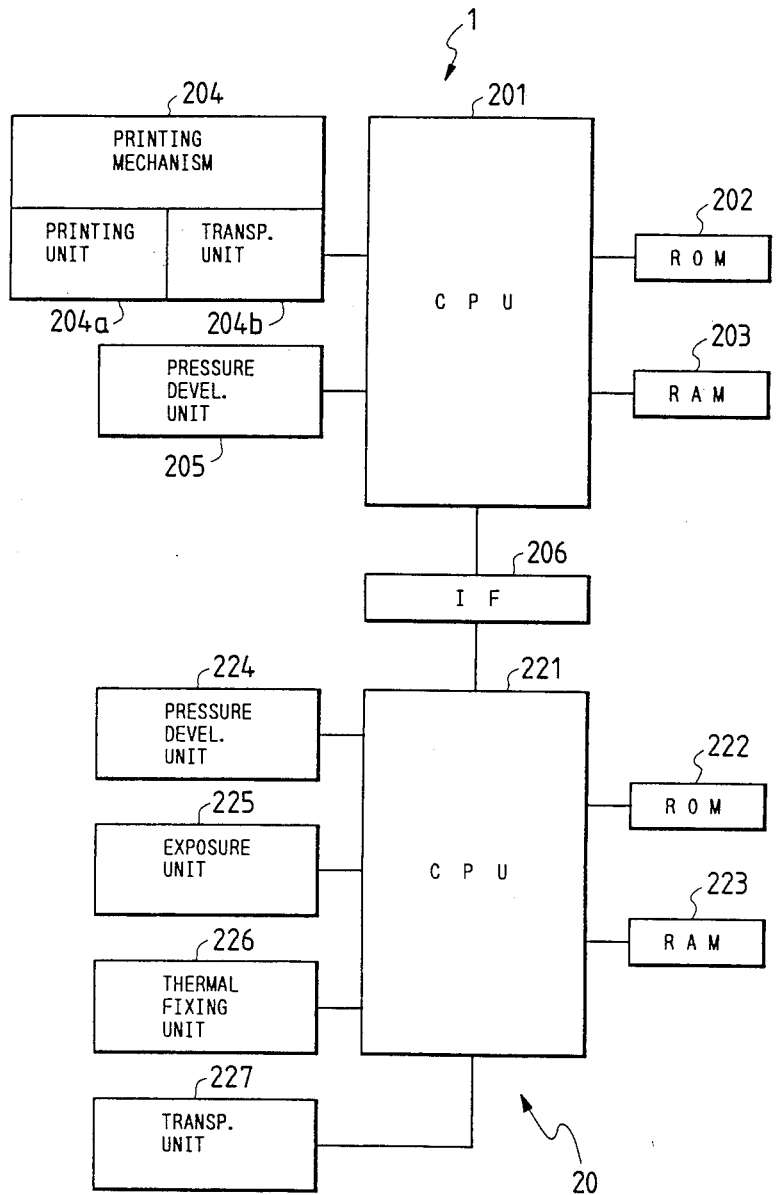
FIG. 3 is a block diagram showing a color image recording apparatus according to one embodiment of the present invention.
Figure 4:
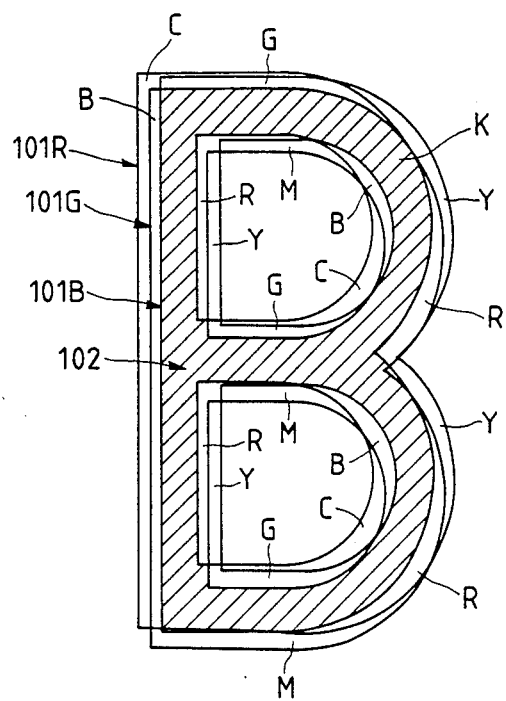
FIG. 4 is an explanatory diagram for description of color slip of a character and thining of a line of the character occurred in a conventional image recording method.

Assuming that image/character data regarding the characters and the full color image on the original 110 has been stored in a host computer 200 shown in FIG. 3, mask members 22R, 22G and 22B for the color image together with a mask member 22K for the characters are produced by the monochromatic laser printer 1. The mask member contains a light shielding image on, for example, a transparent sheet. The mask member 22R produced by the laser printer 1 is conveyed through a guide path 10 to a position of a registration roller 34 where the leading edge of the mask member 22R is brought to alignment with the roller 34. The mask member 22R is then electrostatically adhered to the endless conveyor belt 35 and introduced into the exposure unit 36. The mask member 22R is accurately moved to a particular position in accordance with the movement of the belt 35 so that no color slip does occurs. In the exposure unit 36, the mask member 22R and the recording sheet 24 are placed on an exposure stand 25 while being held in intimate contact with each other and light from the light source 21R is applied to the recording sheet 24A through the mask member 22R, so that a latent image corresponding to the mask or the light shielding image of the mask member 22R is formed on the recording sheet 24A. After the exposure, the mask member 22R is discharged onto the tray 32. Similar operations are carried out with respect to the mask members 22G and 22B while leaving the recording sheet 24A stationary. As a result of three successive exposures, there is provided a recording sheet 24A on which formed is only the latent image corresponding to the three-circle-overlapped image. Exposure for this image portion is hereby terminated. The recording medium is conveyed and brought to facial contact with the developer sheet 26, whereupon a pressure development is carried out by means of the pressure developing unit 28.

In order to record the character portion, the mask member 22K produced by the laser printer 1 is introduced into the exposure unit 36 in the same way as in the case of the mask members 22R, 22G and 22B. In the exposure unit 36, the recording medium 24B is exposed to lights from the light sources 21R, 21G and 21B simultaneously throught the mask member 22K, so that a latent image corresponding to the light shielding character image on the mask member 22K is formed on the recording sheet 24B. There is thus provided a second recording medium 24B on which the latent image of only the character portion is formed. In lieu of the light sources 21R, 21G and 21B, a single white light source may be employed. After the exposure, the mask member 22K is discharged onto the tray 32. During the exposure of the character portion onto the recording sheet 24B, the latent image on the recording sheet 24A is being developed in the pressure developing unit 28 and the developer sheet 26 having a visible image thereon passes through the thermal fixing device 29 which, at this time, in non-actuating state. The developer sheet 26 which has not been subjected to the thermal fixing is discharged onto the tray 30, which in turn inserted into the apparatus from a manual insertion tray 33 and placed in the inlet of the pressure developing unit 28. After completion of the exposure of the character portion, the recording sheet 24B is superposed on the developer sheet 26 inserted from the tray 33 so as not to be displaced from each other. The latent image on the recording sheet 24B is then developed in the developing unit 28 and the characters are recorded in superposition on the developer sheet 26. Thereafter the developer sheet 26 passes through the thermal fixing device 29 where two separately formed images are thermally fixed, and is then discharged onto the tray 30. The used recording sheet 24A, 24B is wound around the take-up roller 37.

As described, the mask members for the color image portion and the black character portion are separately produced. With the use of these two kinds of mask members, exposures onto different recording sheets 24 are separately carried out and both the color image and the black character image are developed and transferred in multiplexed manner onto the same developer sheet. According to such a recording method, the color displacement or color slip can be obviated in the black character portion and a clear character image can be reproduced together with the color image.

Next, an electronic circuit provided interiorly of the apparatus will be described with reference to FIG. 3. The monochromatic laser printer 1 includes a central processing unit (CPU) 201 for controlling the opeation of the printer 1. To the CPU 201, connected are a read-only memory (ROM) 202, a random access memory (RAM) 203, a printing mechanism 204 and an interface (IF) 205. The ROM 202 stores a program for operating the CPU 201 and character data representative of characters and symbols. The RAM 203 functions as a work memory and stores image data therein. The printing mechanism 204 is provided with a printing unit 204a and a transporting unit 204b. The printing unit 204a includes the polygon scanner 2a, the photosensitive drum 3, the developing unit 4 and the fixing unit 6. The transporting unit 204b serves to supply and transport the sheet from the sheet cassette 5. The interface 205 is provided for connecting a host computer (not shown) to the CPU 201.

The color image recording apparatus 20 includes a central processing unit (CPU) 221 for controlling the apparatus 20. To the CPU 221, connected are a ROM 222, a RAM 223, a pressure developing unit 224, an exposure unit 225, a thermal fixing unit 226, a transporting unit 227, and an interface 206. A program is stored in the ROM 222 for operating the CPU 221. The RAM 223 serves as a work memory. The pressure developing unit 224 controls the driving of the pressure developing roller. The exposure unit 225 controls the light sources 21R, 21G and 121B to be selectively or altogether lit. The thermal fixing unit 226 controls the thermal fixing unit 29. The transporting unit 227 controls the transportations of the microcapsule sheet 24, the developer sheet 26 and the mask members 22R, 22G, 22B and 22K. The CPU 221 is coupled through the interface 206 to the CPU 201 to allow the data interchange to be carried out therebetween.

Next, description will be made with reference to the production of the color image mask members 22R, 22G and 22B and the character mask member 22K with the use of the monochromatic laser printer 1, in which entire image data of a color original has been stored in the host computer shown in FIG. 3. It should be noted that the color original contains both a black character image and a full color image.

Figure 1:
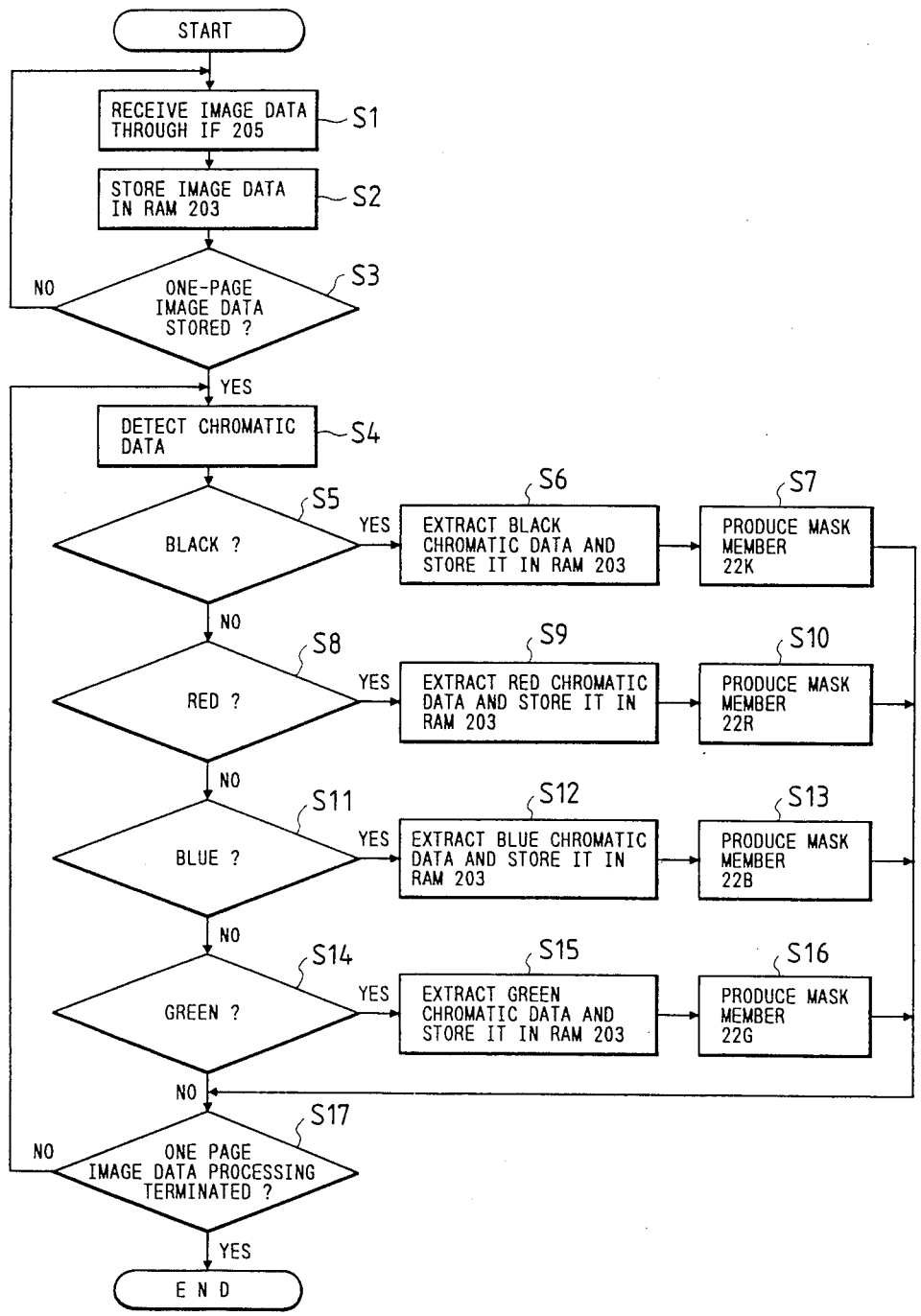
FIG. 1 is a flowchart for description of an image recording method according to the present invention.
Figure 2:
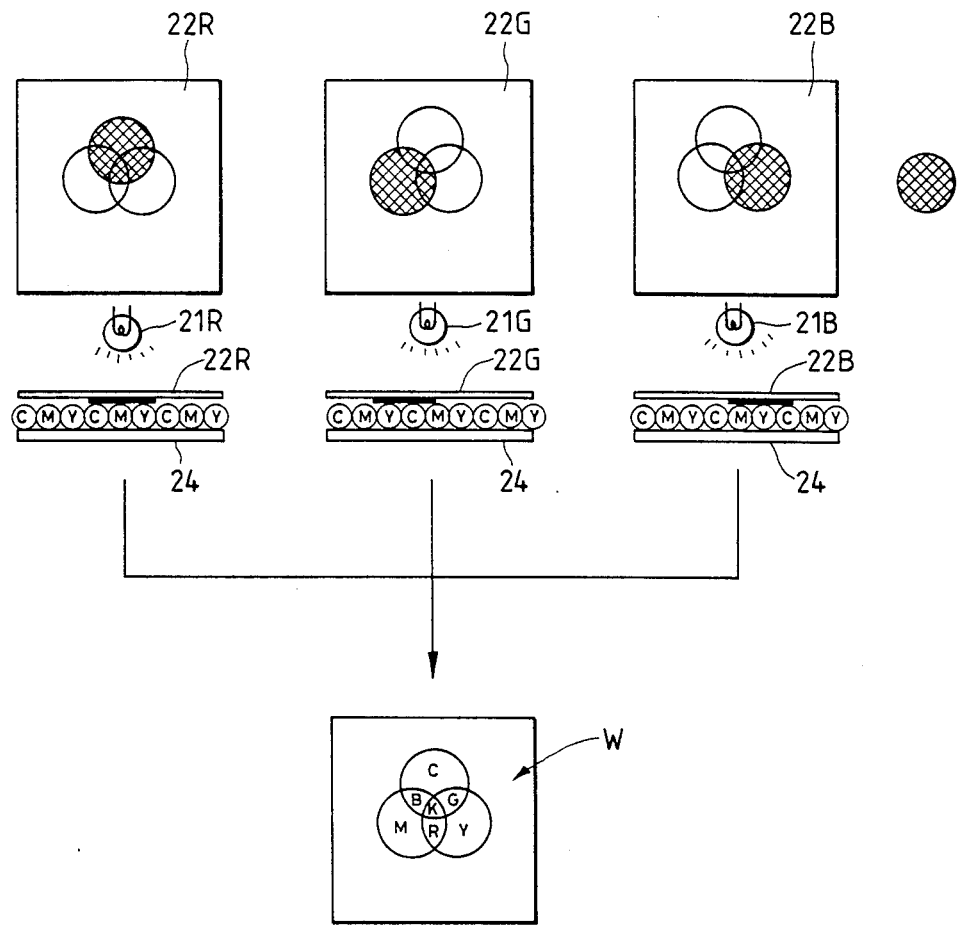
FIG. 2 is an explanatory diagram for description of a principle of a color image recording medium.

Referring to FIG. 1, CPU 201 receives the image data through interface 205 (step 1). The image data is composed of position data indicative of a position on the original 110 and chromatic data indicative of a color of a pixel located in that position. CPU 201 causes to store the image data in RAM 203 (step 2). CPU 201 then checks whether or not the image data for the amount of one page has been stored in RAM 203 (step 3). If NO, the program returns to step 1 and CPU 201 repeatedly executes the processings of steps 1 and 2. If the decision made in step 3 results in YES, CPU 201 detects the chromatic data (step 4). Next, CPU 201 checks whether or not the chromatic data is indicative of black color (step 5). This checking is performed for the purpose of discriminating between a first exposure mode and a second exposure mode. The first exposure mode means that exposure is taken place three or more than three times with the use of the corresponding number of color resolution mask members, and the second exposure mode means that exposure is taken place less than three times with the use of the corresponding number of mask members. Discrimination therebetween may be made at a number other than three.

CPU 201 extracts black chromatic data from the image data and has RAM 203 store it (step 6). Based upon the black chromatic data stored therein, the mask member 22K is produced by the printing mechanism 204 (step 7). This step corresponds to a process for producing an altered color resolution mask member. That is, when the first exposure is carried out, the light shielding image formed on the mask member is altered so that exposure can be taken place with a lesser number of mask members.

If the decision made in step 5 results in NO, CPU 201 checks whether or not the chromatic data is indicative of red (step 8). If the decision made in step 8 is YES, CPU 201 extracts the red color image from the image data and has RAM 203 store it (step 9). CPU 201 actuates the printing mechanism 204 to produce the red mask member 22R (step 10). If the decision made in step 8 is NO, CPU 201 checks whether or not the chromatic data is indicative of blue (step 11). If the decision made in step 11 is YES, CPU 201 extracts blue chromatic data from the image data and has RAM 203 store it (step 12). CPU 201 actuates the printing mechanism 204 to produce the mask member 22B (step 13). If the decision made in step 11 is NO, CPU 201 checks whether or not the chromatic data is indicative of green (step 14). If the decision made in step 14 is YES, CPU 201 extracts green chromatic data from the image data and has RAM 203 store it (step 15). CPU 201 actuates the printing mechanism 204 to produce the mask member 22G (step 16). CPU 201 checks whether or not processing for one page image data has terminated (step 17) and terminate the processings if YES.

Figure 6:
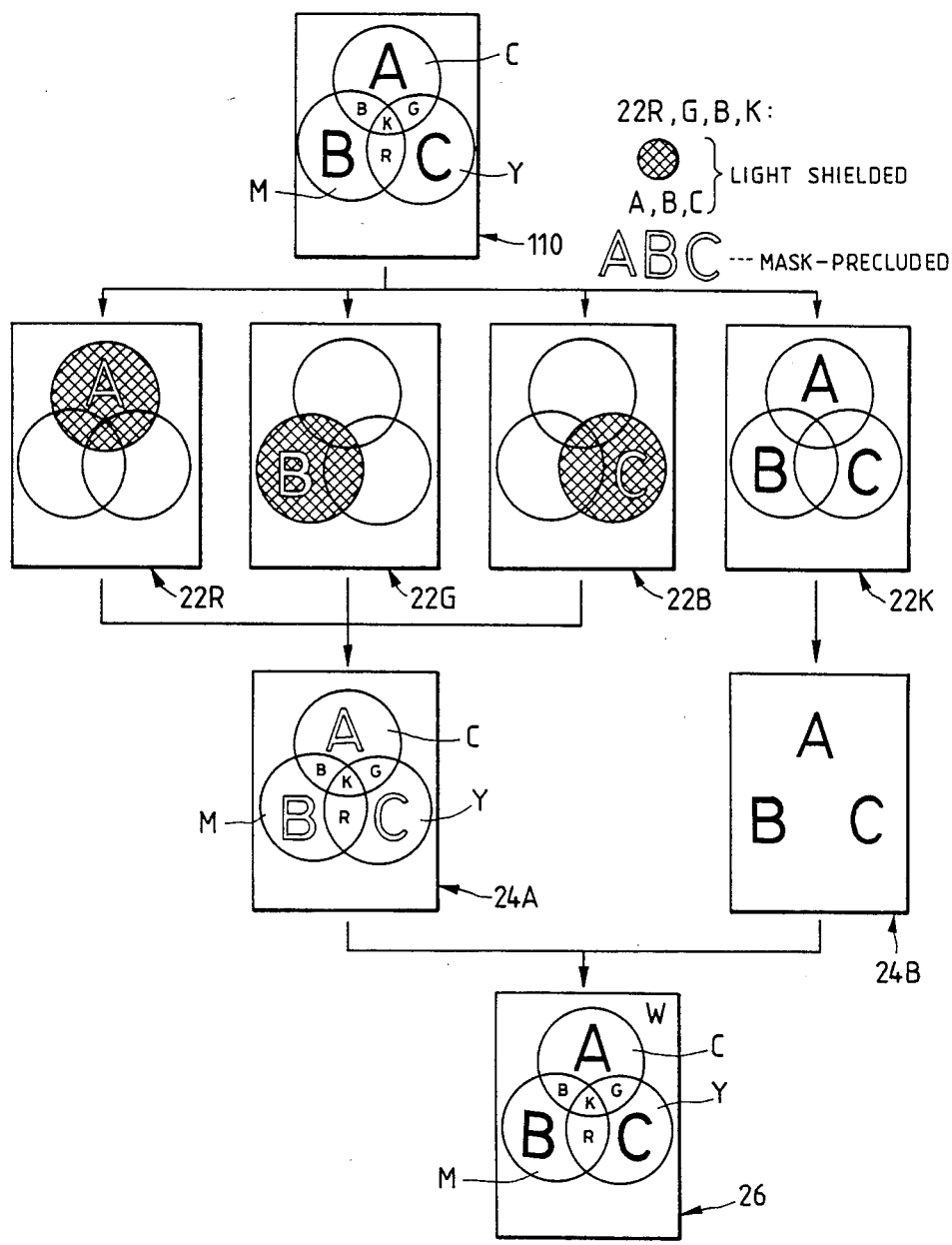
FIG. 6 is an explanatory diagram for description of application of the image recording method according to the present invention.

Referring to FIG. 6, another example of a multiplex image recording will be described. The original 110 shown in FIG. 6 contains characters superposed on a color image. The mask members 22R, 22G and 22B are prepared so that the character portion is blanched or mask-precluded. The blanched character portions have their character sizes slightly smaller than the sizes of the light-shielding characters on the mask member 22K, whereby the black color of the character portions is not mixed with the ground colors when reproduced. With the use of such mask members, a superposed color output image is readily obtained. The blanching processings of the character portions can be effected by simply altering a part of the data transferred from the host computer to the laser printer.

In the foregoing description, the character portions are finally reproduced in black. However, it is possible to reproduce the character portions in various colors other than black. For example, the character portions can be reproduced in blue if the multiplex exposure is carried out in such a manner that the developer sheet 24B is first exposed to lights from the light sources 21R and 21G through the mask member 22K and then exposed to light from the light source 21B without interposing the mask members. If the multiplex exposure is carried in the same fashion, the characer portions can be reproduced in red or green.

As described, according to the first embodiment of the invention, the color displacement or color slip which is liable to occur in the color image reproducing method using color resolution mask members, can be eliminated and a clear color image can be obtained.

Figure 8:
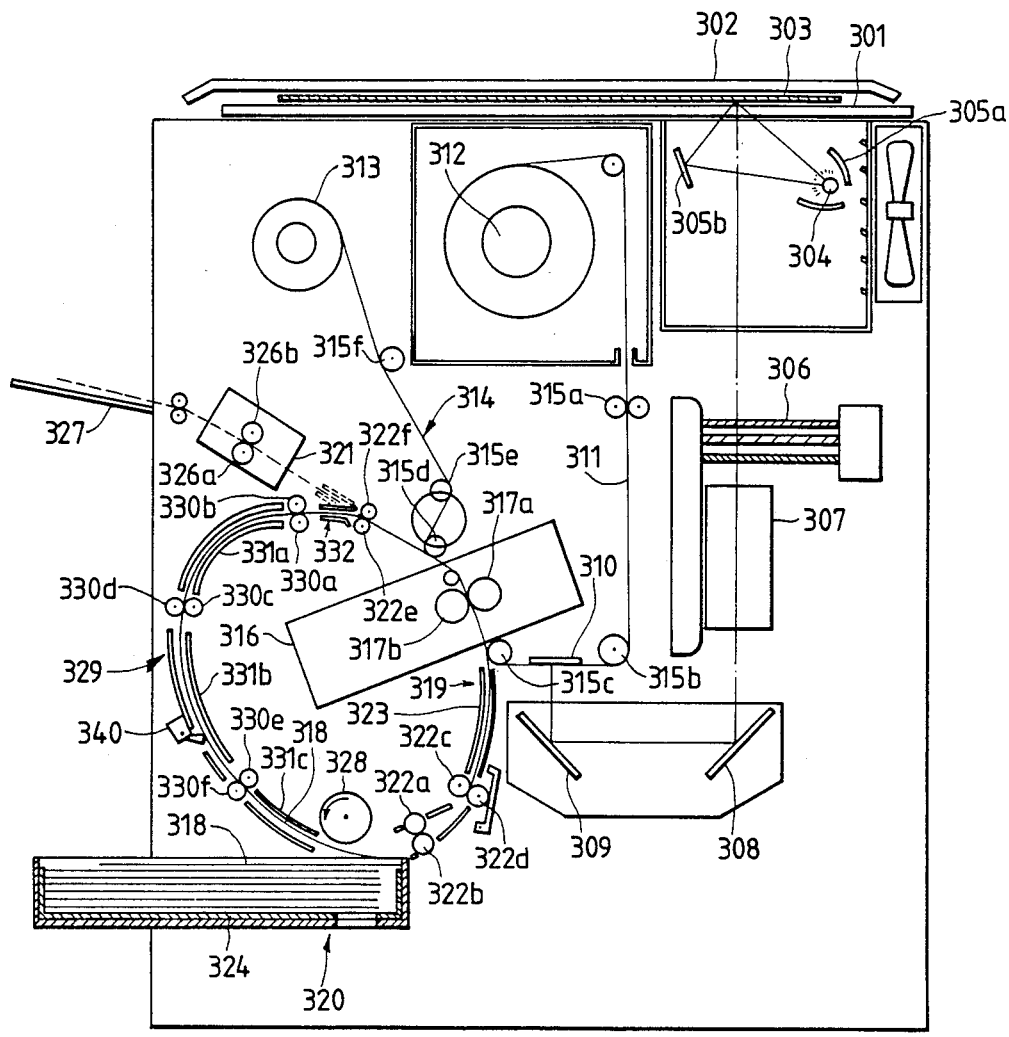
FIG. 8 is a vertical cross-sectional view showing a color image recording apparatus according to one embodiment of the present invention.

Next, a second embodiment of the invention will be described with reference to FIGS. 8 and 9. FIG. 8 is a vertical cross-sectional view showing an image recording apparatus according to the second embodiment. In the upper portion of the apparatus, there are provided an original support stand 301 made of glass and a cover member 302. An original 303 is placed on the stand 301 with its image face down.

As illustrated, the image recording apparatus has its top plate portion constituted by an original support stand cover 302 and an original support stand glass 301 which can slide in the horizontal directions and on which an original 303 is placed. At the upper right section of the apparatus is fixed a light source including a halogen lamp 304 extending in the direction perpendicular to the moving direction of the original support stand glass 301 and a half cylindrical reflector 305a disposed to surround the lamp 304. The light source emits light rays to the original support stand glass 301.

Therefore, the light emitted from the halogen lamp 304 is sequentially irradiated onto the entire surface over the region from the left end to the right end of the original support stand glass 301 by horizontally sliding the glass 301. The light from the light source penetrates the transparent original support stand glass 301 and is reflected at the original 303 placed thereon. The original support stand cover 302 for covering the top surface of the glass 301 is provided in order to prevent this reflection light from leaking from other portion than the original 303.

To irradiate the light from the halogen lamp 304 on the original 303 at a high efficiency, an auxiliary reflector 305b is disposed on the left side of the light source 304 to reflect light which is not directed toward the original 303, so that this light can also be irradiated on the original 303.

On the right of the halogen lamp 304 are a fan and a louver for introducing air into the apparatus. Accordingly, air effectively hits against the original support stand glass 301. Light emitted from the halogen lamp 304 and reflected at the original 303 placed on the original support stand glass 301 passes a filter 306 and enters a lens 307. The filter 306 alters the light transmittivity characteristic in accordance with the sensitivity characteristic of a photosensitive pressure-sensitive recording medium (hereinafter referred to as "microcapsule sheet") 311 to adjust the color tone of a copied image. The lens 307 is mounted to a lens mounting plate and fine angle adjustment for this lens with respect to a light path is possible.

The light focused by the lens 307 changes its direction by 180 degrees by two reflection mirrors 308 and 309 and is applied to the microcapsule sheet 311 closely contacting the bottom of an exposure table 310 to form a latent image thereon. The two reflection mirrors 308 and 309 are securely mounted to a mirror mounting plate, so that the adjustment of the length of the light path and focusing adjustment can be effected by fine adjustment of the position of the mirror mounting plate disposed within the present apparatus.

The elongated microcapsule sheet 311, wound around a cartridge shaft 312, is retained in a cartridge that is detachably disposed under the original support stand glass 301, and one end of the sheet 311 reaches a take-up shaft 313 passing through rollers 315a, 315b, 315c, 315d, 315e and 315f and a pressure developing unit 316.

The microcapsule sheet 31 leaving from the bottom of the cartridge is fed by the feed rollers 315a and guided under the exposure table 310 to the pressure developing unit 316 by the guide rollers 315b and 315c. The microcapsule sheet 311 passing through the pressure developing unit 316 is then guided to a separation roller 315d and zigzag adjusting rollers 315e and 315f and is wound around the take-up shaft 313.

Since the conveying speed of the microcapsule sheet 311 is controlled to be constant by the feed rollers 315a and is made equal to the moving speed of the original support stand glass 311, latent images of given lines of the original 303 are sequentially formed on the microcapsule sheet 311 that is passing under the exposure table 310.

Below the pressure developing unit 316 is disposed a developer sheet cassette 324 for retaining cut-sheet type developer sheets 318. The developer sheets 318 are fed out one by one by a feedout roller 328, and each sheet 318 is fed to a sheet inlet of the pressure developing unit 20 after passing through a pair of rollers 322a and 322b and its leading edge being aligned by a pair of resist gate rollers 322c and 322d.

Accordingly, the microcapsule sheet 311 and the developer sheet 318 are fed, in close contact therewith, to the pressure developing unit 316. The pressure developing unit 316 is constituted by a pair of pressure developing rollers 317a and 317b. The capsule-carrying surface of the microcapsule sheet 311 on which a latent image is formed contacts the developer-coated surface of the developer sheet 318 inside the pressure developing unit 316, and these sheets in this stage are pressed together by the rollers 317a and 317b. The pressure ruptures unexposed microcapsules to thereby form an image on the developer sheet 318. The microcapsule sheet 311 and developer sheet 318 leaving the pressure developing unit 316 are separated by the separation roller 315d, the former sheet 311 is separated to move in upward direction and the latter sheet 318 is separated to move in the straight direction.

A circulation guide path 329 is provided between the output side of the pressure developing unit 316 and the developer sheet cassette 324 for introducing the developer sheet 318 again into the pressure developing unit 316. In downstream of the pressure developing unit 316, a guide unit 332 is provided. As shown in FIG. 9, the guide unit 332 is constituted by upper and lower plates 333a and 333b and two side plates 334. The guide unit 332 is supported to the inside portion of the apparatus through a rod member 335 fixedly secured to the side plates 334. An arm member 336 is provided which has one end fixedly secured to the rod member 335 and another end pivotally connected to a movable rod 338 of a solenoid 337. The solenoid 337 is electrically connected to a multiplex copy button provided in a control panel 400 of the apparatus. To the upper plate 333a, a coil spring 339 is coupled, with which the guide unit 332 is normally applied with a rotating force for rotating the guide unit 332 about the rod member 335 in a direction opposite to the direction in which the guide unit 332 is rotated by the moving rod 338. When the solenoid 337 is not actuated, the guide unit 332 is in the position indicated by solid lines whereas when the solenoid 337 is actuated, the guide unit 332 is in the position indicated by two-dotted-chain lines. When the guide unit 332 is in the former position, the developer sheet 318 is allowed to pass therethrough and discharged onto a discharge tray 327 through a thermal fixing unit 321. The thermal fixing unit 321 is constituted by a hollow heat roller 326a having a heater (not shown) inside thereof and feed roller 326b, and serves to operate the developed image to thermally fix on the developer sheet 318. However, when the guide unit 332 is in the latter position, the developer sheet 318 is led to the circulation guide path 329.

Referring back to FIG. 8, the circulation guide path 332 is constituted with three guide members 331a, 331b and 331c. Between the the guide unit 332 and the first guide member 331a, a pair of guide rollers 330a and 330b are provided. Between the first and the second guide members 331a and 331b, another pair of guide rollers 330c and 330d are provided and between the second and the third guide members 331b and 331c, still another pair of guide rollers 330e and 330f are provided. A paper sensor 340 is provided in the second guide member 331b for sensing the position of the developer sheet 318. When detection is made by the sensor 340 that the developer sheet 318 has circulated to the original position, light scanning for another original is instructed.

Next, description will now be made with respect to a method for recording a plurality of images in superposition on a single developer sheet according to the apparatus shown in FIG. 8.

A first original is placed on the original support stand glass 301 and is irradiated by the light emitted from the halogen lamp 304. The image-bearing light is applied to the microcapsule sheet 311 stationarily held on the exposure table 310 to form a latent image corresponding to the image of the first original on the microcapsule sheet 311. After the exposure, the microcapsule sheet 311 is fed into the pressure developing unit 316, whereat the uppermost developer sheet stacked in the cassette 324 is fed by the rotation of the roller 328 and the microcapsule sheet 311 is brought to facial contact therewith. In the developing unit 316, the latent image on the microcapsule sheet 311 is developed and a visible image is provided on the developer sheet 318. Thereafter the microcapsule sheet 311 is wound around the take-up roller 313.

Figure 9:
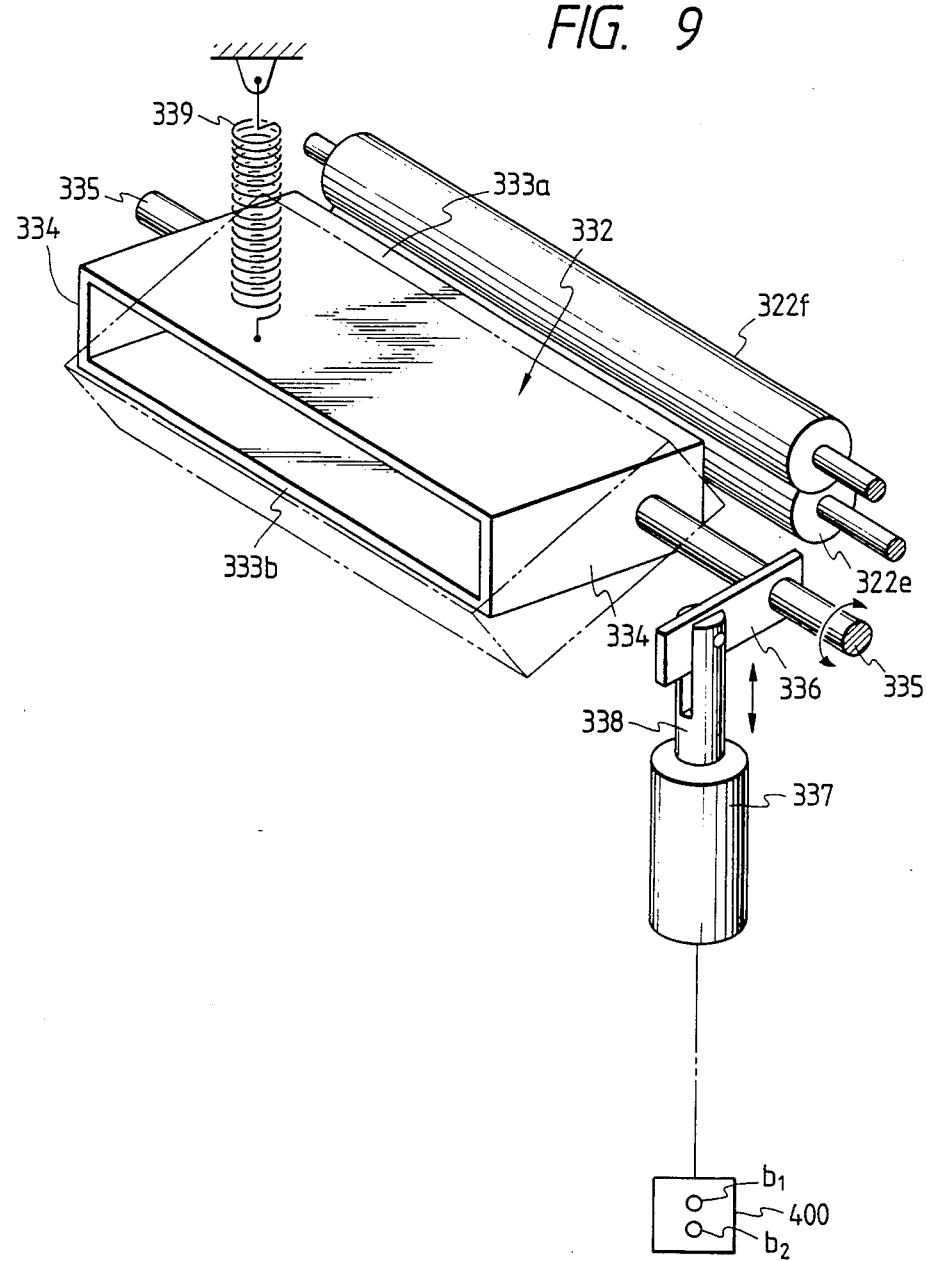
FIG. 9 is a perspective view showing a guide unit provided in the apparatus shown in FIG. 8.

Assuming that a copy button b1 has been depressed at the time of start of the copying operation, the guide unit 332 is in the position indicated by the solid line as shown in FIG. 9 and the developer sheet 318 is allowed to pass therethrough as described hereinbefore. The developer sheet 318 is then introduced into the thermal fixing unit 321 where the developed image is thermally fixed, and discharged onto the tray 327.

Assuming that a multiplex copy button b2 has been depressed at the time of start of the copying operation, the guide unit 332 is in the position indicated by two-dotted-chain line in FIG. 9 due to the actuation of the solenoid 337. Therefore, the developer sheet 318 is fed into the circulation guide path 329 and is brought to the position immediately above the cassette 324. At this time, the first original is removed from the original support stand glass 301 and a second original is placed thereon. A latent image corresponding to the image of the second original is formed on the microcapsule sheet 311 and is fed into the developing unit 316. Before entering the developer sheet 316, the microcapsule sheet 311 is brought to facial contact with the developer sheet being circulated along the path 329, and the latent image corresponding to the image of the second original is developed and the visible image is provided in superposition on the image already provided.

The above-described operations may be repeatedly carried out, so that a plurality of images each on different original are recorded in superposition on a single sheet. After the superposed image recording has terminated, the superposed image on the developer sheet is thermally fixed in the thermal fixing unit and is then discharged onto the tray 327.

Although the present invention has been described with reference to specific embodiments, it can be appreciated that the present inventin is not limited thereto but a variety of changes and modifications may be made without departing from the scope and spirit of the invention. For example, in the second embodiment, a link mechanism may be employed in lieu of the rotation mechanism for rotating the guide unit 332. Moreover, the circulation guide path may be constructed by the use of an enless conveyor belt in lieu of the guide plates and the rollers.

What is claimed is:

1. A method of recording a predetermined number of images on a first recording medium with the use of two sheets of a second recording medium, said method comprising the steps of:
   discriminating said predetermined number of images between a first group containing a first number of images and a second group containing a second number of images;
   sequentially forming a latent image of each of said first number of images in superposition on one of said two second recording mediums;
   sequentially forming a latent image of each of said second number of images in superposition on the other of said two second recording mediums; and
   sequentially developing said latent images of each of said two second recording mediums and providing visible images in superposition on said first recording medium.

2. A method according to claim 1, wherein said predetermined number of images contain a fine line image which is discriminated from the reminder and is defined as being in said first group.

3. A method according to claim 2, further comprising the step of providing a predetermined number of mask members equal to said predetermined number of images based upon an original containing an image to be reproduced.

4. A method according to claim 3, wherein each of said predetermined number of mask members contains a light shielding image corresponding to each of said predetermined number of images, and wherein said latent image of each of said first number of images is sequentially formed in superposition on said one of said two recording mediums by irradiating light thereonto through said mask members corresponding to said first group and said latent images of each of said second number of images is sequentially formed in superposition on the other of said two recording mediums by irradiating light thereonto through said mask members corresponding to said second group.

5. A method according to claim 4, wherein said first recording medium is a developer sheet having one surface coated with a developer material and said second medium is a photosensitive and pressure-sensitive sheet having one surface coated with a plurality of microcapsules each encapsulating therein a chromogenic material, a mechanical strength of said microcapsule being changed when exposed to light, and said visible image being provided by rupturing said microcapsules of weaker mechanical strength and reacting said chromogenic material released from the ruptured microcapsules with said developer material, and wherein said latent image is formed on said photosensitive and pressure-sensitive sheet by irradiating thereonto a light bearing each of said plurality of images.

6. A method according to claim 5, further comprising the step of thermally fixing said visible images recorded in multiplex form on said first recording medium.

7. A method according to claim 6, wherein said fine line image is visibly provided on said first recording medium in monochromatic color.

8. A method according to claim 6, wherein said images in said second group is visibly provided on said first recording medium in colors corresponding to those in said original.

* * * * *